US009911898B2

(12) United States Patent
Choi et al.

(10) Patent No.: US 9,911,898 B2
(45) Date of Patent: Mar. 6, 2018

(54) ULTRAVIOLET LIGHT-EMITTING DEVICE (71) Applicant: Seoul Viosys Co., Ltd., Ansan-si (KR)

(72) Inventors: Hyo Shik Choi, Ansan-si (KR); Jung Hwan Hwang, Ansan-si (KR); Chang Suk Han, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/404,985

(22) Filed: Jan. 12, 2017

(65) Prior Publication Data

US 2017/0125634 A1 May 4, 2017

Related U.S. Application Data (63) Continuation of application No. 14/784,007, filed as application No. PCT/KR2014/001879 on Mar. 7, 2014, now Pat. No. 9,577,144.

(30) Foreign Application Priority Data

Apr. 12, 2013 (KR) .......................... 10-2013-0040513

(51) Int. Cl.
*H01L 33/06* (2010.01)
*H01L 33/04* (2010.01)
(Continued)

(52) U.S. Cl.
CPC .......... *H01L 33/06* (2013.01); *H01L 33/0025* (2013.01); *H01L 33/04* (2013.01);
(Continued)

(58) Field of Classification Search
CPC ..... H01L 33/0025; H01L 33/04; H01L 33/06; H01L 33/14; H01L 33/145; H01L 33/32
See application file for complete search history.

(56) References Cited

U.S. PATENT DOCUMENTS 9,318,652 B1    4/2016   Liao
9,627,580 B2 *   4/2017   Liao ................. H01L 21/02507
(Continued)

FOREIGN PATENT DOCUMENTS

CN          1669158 A      9/2005
CN      102782883 A    11/2012
(Continued)

OTHER PUBLICATIONS

Korean Intellectual Property Office, International Search Report for International Application No. PCT/KR2014/001879, dated Jun. 26, 2014, 2 pages.
(Continued)

*Primary Examiner* — Allan R Wilson
(74) *Attorney, Agent, or Firm* — Perkins Coie LLP (57) ABSTRACT

Disclosed is an ultraviolet light-emitting device. The light-emitting device includes: an n-type contact layer including a GaN layer; a p-type contact layer including an AlGaN or AlInGaN layer; and an active region of multiple quantum well structure positioned between the n-type contact layer and the p-type contact layer. In addition, the active region of multiple quantum well structure includes a GaN or InGaN layer with a thickness less than 2 nm, radiating an ultraviolet ray with a peak wavelength of 340 nm to 360 nm.

20 Claims, 3 Drawing Sheets

(51) Int. Cl.
*H01L 33/32* (2010.01)
*H01L 33/00* (2010.01)
*H01L 33/14* (2010.01)

(52) U.S. Cl.
CPC ............ *H01L 33/14* (2013.01); *H01L 33/145* (2013.01); *H01L 33/32* (2013.01)

(56) References Cited

U.S. PATENT DOCUMENTS

| | | |
|---|---|---|
| 2005/0236642 A1 | 10/2005 | Sakai |
| 2006/0175600 A1 | 8/2006 | Sato |
| 2007/0051962 A1* | 3/2007 | Lai .......................... H01L 33/08 257/94 |
| 2010/0096650 A1* | 4/2010 | Ubahara ................. H01L 33/06 257/94 |
| 2012/0049156 A1 | 3/2012 | Ohta |
| 2012/0205620 A1 | 8/2012 | Sato et al. |
| 2014/0103289 A1 | 4/2014 | Liao |
| 2015/0041760 A1 | 2/2015 | Han |
| 2017/0104131 A1* | 4/2017 | Shatalov ................. H01L 33/22 |

FOREIGN PATENT DOCUMENTS

| | | |
|---|---|---|
| CN | 102867894 A | 1/2013 |
| JP | 2012199174 | 10/2012 |
| JP | 2012244163 | 12/2012 |
| KR | 1020110133240 | 12/2011 |
| KR | 1020120021785 | 3/2012 |

OTHER PUBLICATIONS

Wang et al., "1 MW AlInGaN-based Ultraviolet Light-emitting Diode with an Emission Wavelenght of 348 Nm Grown on Sapphire Substrate," Applied Physics Letters, vol. 81, No. 14, Sep. 30, 2002, pp. 2508-2510.

First Office Action in Chinese Patent Application No. 201480020854.4, dated May 3, 2017 (with English translation), 16 pages.

* cited by examiner

ULTRAVIOLET LIGHT-EMITTING DEVICE

CROSS REFERENCE TO RELATED APPLICATION

This application is a continuation of, and claims the benefits and priority to, U.S. Patent Application No. 14/784,007, filed on Oct. 12, 2015, which is the National Stage of International Application No. PCT/KR2014/001879, filed on Mar. 7, 2014, and claims the benefits and priority of prior Korean Patent Application No. 10-2013-0040513, filed on Apr. 12, 2013, which are all hereby incorporated by reference for all purposes as if fully set forth herein.

TECHNICAL FIELD

The present invention relates to an inorganic semiconductor light emitting device, and more particularly, to an ultraviolet (UV) light emitting device that emits ultraviolet having a wavelength which is not more than 360 nm.

BACKGROUND ART

In general, a gallium nitride based semiconductor has been widely used for ultraviolet, a blue/green light emitting diode, or a laser diode, as a light source of a full color display, a traffic light, a general lighting, and an optical communication device. Particularly, an indium gallium nitride (InGaN) compound semiconductor has increasingly been highlighted due to a narrow band gap thereof.

A light emitting device using the gallium nitride based compound semiconductor has been utilized in various applications such as a large scale full color flat panel display device, a backlight source, a traffic signal, an indoor lighting, a high density light source, a high resolution output system, optical communication, and the like. GaN has a band gap energy of about 3.42 eV, which corresponds to optical energy having a wavelength of about 365 nm. Thus, the light emitting device that uses GaN or InGaN as a well layer, has generally been used to radiate ultraviolet or blue light having a wavelength which is not less than 365 nm. Meanwhile, in order to provide the light emitting diode that radiates ultraviolet having a wavelength which is not more than 365 nm, there is a need to increase a band gap of the well layer, and as a result, the well layer with aluminum (Al) added to GaN or InGaN is used (see Korean Patent Laid Open Publication No. 10-2012-0129449).

Further, a barrier layer or a contact layer includes a higher Al content than an AlGaN or AlInGaN well layer so as to have a wider band gap than the well layer However, as the Al content increases, the AlGaN or AlInGaN layer should be grown at a higher temperature and lower pressure. That is, a growth condition thereof becomes strict, and as a result, it is difficult to form an epi-layer having good crystal quality. Further, as the Al content increases, crystal defects such as cracks or threading dislocations caused by stress are prone to occur in the epi-layer, and as a result, it is difficult to form the epi-layer having good crystal quality.

DISCLOSURE

Technical Problem

An object of the present invention is to provide an ultraviolet (UV) light emitting device capable of emitting ultraviolet having a wavelength in the range of 340 nm to 360 nm.

Another object of the present invention is to provide a UV light emitting device in which crystal quality of a well layer is improved.

Technical Solution

According to an aspect of the present invention, there is provided a light emitting device including: an n-type contact layer including a GaN layer; a p-type contact layer including an AlGaN layer or an AlInGaN layer; and an active region having a multiple quantum well structure disposed between the n-type contact layer and the p-type contact layer. Further, the active region having the multiple quantum well structure includes well layers formed of GaN or InGaN having a thickness which is less than 2 nm and emits ultraviolet having a peak wavelength in the range of 340 nm to 360 nm.

The well layers formed of GaN or InGaN are formed to have a thickness which is less than 2 nm, such that a band gap is quantized, thereby making it possible to radiate ultraviolet having a peak wavelength in the range of 340 nm to 360 nm. Further, the n-type contact layer includes the GaN layer, such that the well layers having good crystal quality may be formed, and the well layers formed of GaN or InGaN that do not contain Al are used, such that well layers having better crystal quality may be formed.

Meanwhile, the well layers formed of GaN or InGaN may have a thickness which is not less than 1 nm but less than 2 nm. A lower limit of the thickness of the well layers formed of GaN or InGaN is not particularly limited as long as the well layers formed of GaN or InGaN performs a function as the well layer, but may be preferably not less than 1 nm for stability of an epi-layer growth process.

Meanwhile, the active region having the multiple quantum well structure further includes barrier layers. Here, the barrier layers may contain Al and may be formed of AlInGaN. The barrier layers include In, such that a lattice mismatching between the well layers and the barrier layers may be alleviated.

According to some exemplary embodiments, the well layers and the barrier layers of the active region having the multiple quantum well structure may be grown at different growth temperatures. Further, the well layers and the barrier layers may be grown by successively introducing source gas of In, Ga, and N into a chamber and intermittently introducing source gas of Al into the chamber.

According to other exemplary embodiments, the well layers and the barrier layers of the active region having the multiple quantum well structure may be grown at the same growth temperature as each other.

Meanwhile, the light emitting device may further radiate ultraviolet having a peak wavelength in the range of 360 nm to 400 nm together with the ultraviolet having the peak wavelength in the range of 340 nm to 360 nm.

According to some exemplary embodiments, the p-type contact layer may include a lower AlGaN high concentration doping layer, an upper AlGaN high concentration doping layer, and an AlGaN low concentration doping layer disposed between the lower AlGaN high concentration doping layer and the upper AlGaN high concentration doping layer. Further, the AlGaN low concentration doping layer may have a thickness thicker than that of the lower and upper AlGaN high concentration doping layers. By adopting the low concentration doping layer, mobility of holes is increased, thereby making it possible to improve hole injection efficiency.

The light emitting device may further include: a superlattice layer disposed between the n-type contact layer and the active region; and an electron injection layer disposed between the superlattice layer and the active region. Further, the electron injection layer may have n-type impurity doping concentration higher than that of the superlattice layer.

In addition, the superlattice layer may have a structure in which InGaN/InGaN is repeatedly laminated, and the electron injection layer may be formed of GaN or InGaN.

Meanwhile, the light emitting device may further include an undoped GaN layer disposed between the n-type contact layer and the superlattice layer.

According to a specific exemplary embodiment, epilayers between the n-type contact layer and the active region may be formed of nitride based semiconductor layers that do not contain the AlGaN layer.

Advantageous Effects

According to the related art, a light emitting device that radiates ultraviolet having a wavelength which is less than 360 nm uses a well layer containing Al and also has an n-type contact layer formed of AlGaN. Since the contact layer occupying the most of the thickness of the light emitting device except for a substrate is formed of AlGaN, crystal quality of an epi-layer, particularly, the well layer is bad and as a result, it is difficult to improve optical power or light emission efficiency. On the contrary, according to the present invention, the well layer is formed of GaN or InGaN and the n-type contact layer is formed of GaN, thereby making it possible to form the well layer having good crystal quality. Further, the well layer is formed to have a thin thickness which is less than 2 nm, such that a light emitting device that radiates ultraviolet having a peak wavelength in the range of 340 nm to 360 nm by the well layer formed of GaN or InGaN may be provided.

BEST MODE

Hereinafter, exemplary embodiments of the present invention will be described in detail with reference to the accompanying drawings. The exemplary embodiments of the present invention to be described below are provided by way of example so that the idea of the present invention can be sufficiently transferred to those skilled in the art. Therefore, the present invention is not limited to the exemplary embodiments to be described below but may be modified in many different forms. In addition, in the accompanying drawings, widths, lengths, thicknesses, or the like, of components may be exaggerated for convenience. Like reference numerals denote like elements throughout the specification. Meanwhile, in the present specification, the content of a metal element (Al or In) denoted by a percentage denotes a composition of each metal component for a summation of compositions of metal components of a gallium nitride based layer by percentage. That is, the content of Al of the gallium nitride based layer denoted by $Al_xIn_yGa_zN$ is calculated by $100 \times x/(x+y+z)$ and is expressed by %.

Figure 1:
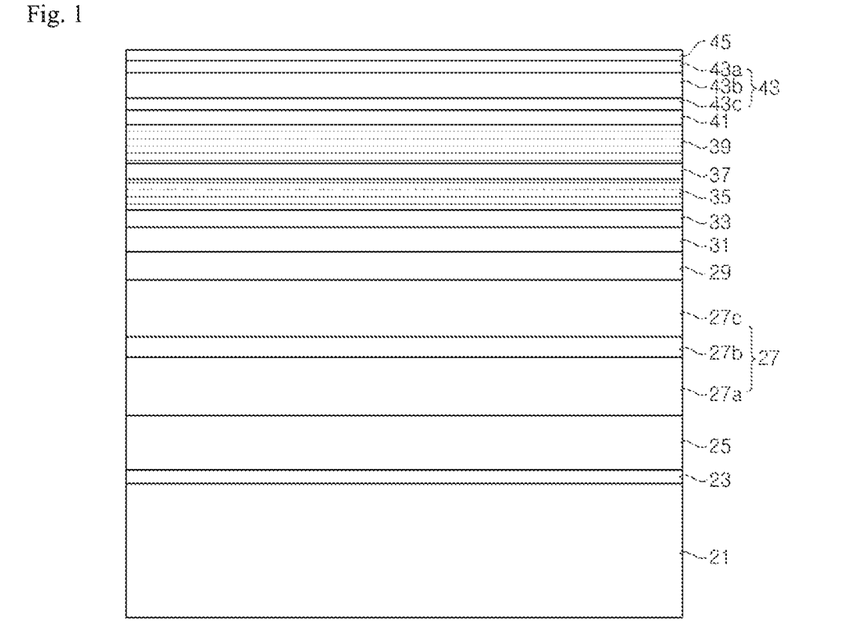
FIG. 1 is a cross-sectional view illustrating a light emitting device according to an exemplary embodiment of the present invention.
Figure 2:
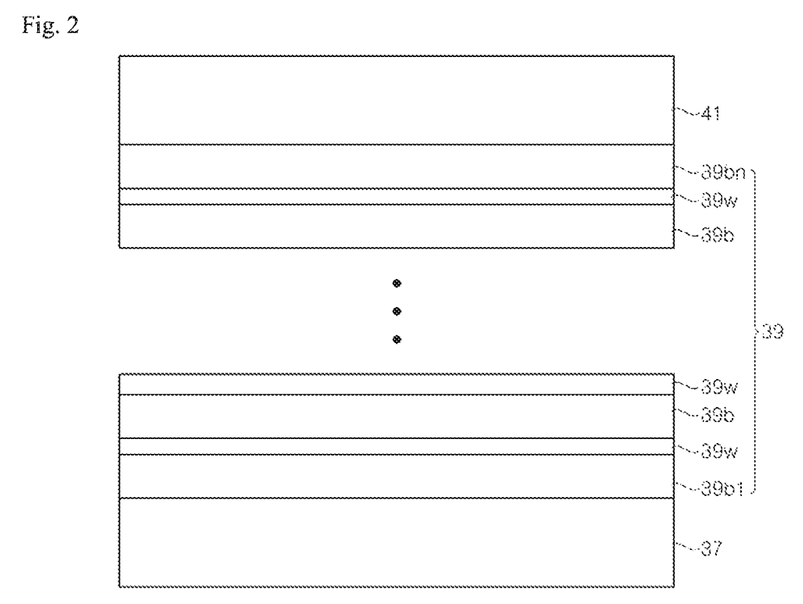
FIG. 2 is a cross-sectional view illustrating a multiple quantum well structure of the light emitting device according to an exemplary embodiment of the present invention.

FIG. 1 is a cross-sectional view illustrating a light emitting device according to an exemplary embodiment of the present invention and FIG. 2 is an enlarged cross-sectional view illustrating a multiple quantum well structure of the light emitting device.

Referring to FIG. 1, the light emitting device includes an n-type contact layer 27, an active region 39, and a p-type contact layer 43. Further, the light emitting device may include a substrate 21, a nuclear layer 23, a buffer layer 25, an undoped GaN layer 29, a low concentration GaN layer 31, a high concentration GaN layer 33, a superlattice layer 35, an electron injection layer 37, an electron blocking layer 41, or a delta doped layer 45.

The substrate 21, which is a substrate for growing a gallium nitride based semiconductor layer, is not particularly limited to a sapphire substrate, an SiC substrate, a spinel substrate, a GaN substrate, and the like, but may be, for example, a patterned sapphire substrate (PSS).

The nuclear layer 23 may be formed of (Al, Ga)N at a low temperature of 400 to 600° C. in order to grow the buffer layer 25 on the substrate 21, and may be preferably formed of GaN or AlN. The nuclear layer may be formed to have a thickness of about 25 nm. The buffer layer 25, which is a layer for alleviating a defect occurrence such as dislocation between the substrate 21 and the n-type contact layer 27, is grown at a relatively high temperature. The buffer layer 25 may be formed of, for example, undoped GaN to have a thickness of about 1.5 μm.

The n-type contact layer 27 is formed of a gallium nitride based semiconductor layer to which an n-type impurity, for example, Si is doped, and may be formed to have a thickness of, for example, about 3 μm. The n-type contact layer 27 may include a GaN layer and may be formed of a single layer or multiple layers. For example, the n-type contact layer 27 may include a lower GaN layer 27a, an intermediate layer 27b, and an upper GaN layer 27c, as illustrated. Here, the intermediate layer 27b may be formed of AlInN, or may be formed of a multilayer structure (including a superlattice structure) in which AlInN and GaN are laminated in turns, for example, at about 10 periods. The lower GaN layer 27a and the upper GaN layer 27c may be formed to have thicknesses similar to each other, and may be formed to have the thickness of, for example, about 1.5 μm, respectively. The intermediate layer 27b may be formed to have a thickness relatively smaller than the lower and upper GaN layers 27a and 27c, and may be formed to have the thickness of about 80 nm. By inserting the intermediate layer 27b into an intermediate portion of the n-type contact layer 27, crystal quality of an epi-layer formed on the n-type contact layer 27, particularly, an active region 39 may be improved as compared to the case in which a single GaN layer is successively grown to a thickness of about 3 μm to be relatively thick. Meanwhile, Si doping concentration doped to the n-type contact layer 27 may be in the range of $2 \times 10^{18}/cm^3$ to $2 \times 10^{19}/cm^3$, and may be more preferably in the range of $1 \times 10^{19}/cm^3$ to $2 \times 10^{19}/cm^3$. Particularly, an Si impurity may be doped on the lower GaN layer 27a and the upper GaN layer 27c at high concentration and may be doped to the intermediate layer 27b to the same level as or a lower level than the upper GaN layer 27c, and the impurity may also not be intentionally doped. Since the impurity is doped to the lower GaN layer 27a and the upper GaN layer 27c at the high concentration, a resistive component of the n-type contact layer 27 may be decreased. An electrode which is in contact with the n-type contact layer 27 may also be in contact with the upper GaN layer 27c.

The undoped GaN layer 29 may be formed of GaN to which the impurity is not intentionally doped, and may be formed to have a thickness relatively thinner than that of the upper GaN layer 27c, for example, 80 nm to 300 nm. As the n-type impurity is doped to the n-type contact layer 27, residual stress occurs in the n-type contact layer 27 and crystal quality is degraded. As a result, in the case in which another epi-layer is grown on the n-type contact layer 27, it is difficult to grow the epi-layer having good crystal quality. However, since the impurity is not doped to the undoped GaN layer 29, the undoped GaN layer 29 acts as a restoring layer of restoring degradation in crystal quality of the n-type contact layer 27. Therefore, it is preferable to directly form the undoped GaN layer 29 on the n-type contact layer 27 to be in contact with the n-type contact layer 27. In addition, since the undoped GaN layer 29 has specific resistance relatively higher than that of the n-type contact layer 27, electrons introduced into the active layer 39 from the n-type contact layer 27 may be evenly dispersed within the n-type contact layer 27 before passing through the undoped GaN layer 29.

The low concentration GaN layer 31 is disposed on the undoped GaN layer 29 and has n-type impurity doping concentration doped at lower concentration than the n-type contact layer 27. The low concentration GaN layer 31 may have an Si doping concentration in the range of $5 \times 10^{17}/cm^3$ to $5 \times 10^{18}/cm^3$, for example, and may be formed to have a thickness relatively thinner than that of the undoped GaN layer 29, for example, a thickness of 50 nm to 150 nm. Meanwhile, the high concentration GaN layer 33 is disposed on the low concentration GaN layer 31 and has higher n-type impurity doping concentration than the low concentration GaN layer 31. The high concentration GaN layer 33 may have Si doping concentration of a level which is substantially similar to the n-type contact layer 27. The high concentration GaN layer 33 may have a thickness relatively thinner than that of the low concentration GaN layer 31, and may be formed to have a thickness of about 30 nm, for example.

The n-type contact layer 27, the undoped GaN layer 29, the low concentration GaN layer 31, and the high concentration GaN layer 33 may be successively grown by supplying metal source gas into a chamber. As raw materials of the metal source gas, organic materials such as Al, Ga, and In, for example, TMA, TMG, and/or TMI are used. Meanwhile, as source gas of Si, $SiH_4$ may be used. These layers may be grown at a first temperature, for example, 1050° C. to 1150° C.

The superlattice layer 35 is disposed on the high concentration GaN layer 33. The superlattice layer 35 may be formed by alternately laminating gallium nitride based layers having different compositions, for example, a first InGaN layer and a second InGaN layer to a thickness of, for example, 20 Å, respectively, at about 30 periods. The superlattice layer 35 may be formed of an undoped layer without intentionally doping the impurity. Since the superlattice layer 35 is formed of the undoped layer, a leakage current of the light emitting device may be decreased.

The electron injection layer 37 has n-type impurity doping concentration relatively higher than that of the superlattice layer 35. Further, the electron injection layer 37 may have the n-type impurity doping concentration of substantially the same level as that of the n-type contact layer 27. For example, the n-type impurity doping concentration may be in the range of $1 \times 10^{19}/cm^3$ to $5 \times 10^{19}/cm^3$, and may be more preferably in the range of $1 \times 10^{19}/cm^3$ to $3 \times 10^{19}/cm^3$. As the electron injection layer 37 is doped at high concentration, electrons are smoothly injected into the active region 39. The electron injection layer 37 may be formed to have a thickness which is similar to or relatively smaller than that of the high concentration doping layer 33, for example, a thickness of about 20 nm. In addition, the electron injection layer 37 may be grown at a temperature of about 820 to 850° C. and a pressure of about 300 torr.

The active region 39 is disposed on the electron injection layer 37. FIG. 2 is an enlarged cross-sectional view illustrating the active region 39.

Referring to FIG. 2, the active region 39 has a multiple quantum well structure including barrier layers 39b and well layers 39w which are laminated alternately with each other. The well layers 39w radiate ultraviolet having a wavelength in the range of 340 nm to 360 nm. The well layers 39w may be formed of InGaN or GaN. Here, the content of In contained in the well layer 39w may be very small, and may be, for example, less than about 2%. The well layers 39w may be formed to have a thickness which is not less than about 1 nm but less than 2 nm. Since the well layers 39w have the thickness which is less than 2 nm, a width of a quantized band gap is increased, and may consequently radiate ultraviolet having a peak wavelength in the range of 340 to 360 nm by GaN or InGaN. The well layers 39w may be grown at a temperature relatively higher than a growth temperature of well layers of a general blue light emitting diode, for example, at 800 to 820° C. and about 300 torr, and as a result, crystal quality of the well layer may be improved.

The barrier layers 39b may be formed of a gallium nitride based semiconductor layer having a band gap wider than that of the well layers, for example, GaN, InGaN, AlGaN, or AlInGaN. Particularly, the barrier layers 39b may be formed of AlInGaN, where the barrier layers 39b include In, thereby making it possible to alleviate lattice mismatch between the well layer 39w and the barrier layer 39b. Further, by increasing the content of Al in the barrier layers 39b, an energy band gap difference between the well layer and the barrier layer may be increased, and as a result, the wavelength of the radiated light may become shorter.

In addition, the barrier layers 39b may be grown at a growth temperature slightly higher than that of the well layer (e.g., about 800 to 820° C). , for example, at about 820 to 850° C. and about 300 torr. For example, the barrier layer 39b may be grown by increasing the temperature after the well layer 39w is grown. Here, the barrier layer may be grown by stopping an introduction of source gas of In and Ga introduced into the chamber after growing the well layer 39w and again introducing source gas of In, Ga, and Al after increasing the growth temperature. Unlike this, the well layers 39w and the barrier layers 39b may be grown by successively introducing the source gas of In, Ga, and N into the chamber and intermittently introducing the source gas of Al into the chamber. Here, the introduction of the source gas of Al may be started after the growth temperature is increased to the growth temperature of the barrier layer, and may also be started during a process of increasing the temperature. The source gas is successively introduced, thereby making it possible to prevent crystal quality of the well layer from being degraded during a process of increasing the temperature.

According to some exemplary embodiments, the barrier layers 39b may be grown at the same growth temperature as that of the well layers 39w. In this case, the barrier layers 39b and the well layers 39w may be grown at the same temperature in the range of 800 to 850° C., for example. Since the well layer 39w and the barrier layer 39b are grown at the same temperature, evaporation of In and Al which might occur due to an increase in the temperature may be prevented, thereby making it possible to improve interface characteristics between the well layer and the barrier layer.

Meanwhile, a first barrier layer 39b1 which is closest to the electron injection layer 37 or the n-type contact layer 27 among the barrier layers 39b1, 39b, and 39bn may have the content of Al higher than that of other barrier layers. For example, the content of Al of the first barrier layer 39b1 may be higher than that of other barrier layers 39b as much as 10% to 20%. For example, in the case in which Al of about 20% is contained in other barrier layers 39b and 39bn, Al of about 30 to 40% may be contained in the first barrier layer 39b1. The content of In contained in the barrier layers 39b1, 39b, and 39bn may be not more than about 1%. Particularly, in the case in which the well layers 39w are formed of InGaN to radiate ultraviolet having the wavelength of 340 to 360 nm, other barrier layers 39b and 39n except for the first barrier layer 39b1 may be formed of AlInGaN containing Al of 15 to 25% and In which is not more than 1%, and the first barrier layer 39b1 may be formed of AlInGaN containing Al of 30 to 40% and In which is not more than 1%.

In the light emitting device, the barrier layers are generally formed to have the same composition as each other. However, according to the present exemplary embodiment, the first barrier layer 39b1 has the content of Al higher than that of other barrier layers 39b as much as 10 to 20%. According to the present invention, the electron injection layer 37 or the n-type contact layer 27 is formed of GaN. A band gap difference between the well layer 39w and GaN that radiate ultraviolet is not relatively large. Therefore, the first barrier layer 39b1 is formed to have the band gap relatively higher than that of other barrier layers 39b, such that the first barrier layer 39b1 may perform a function of confining carriers within the active region 39. Particularly, in the case in which the barrier layer formed of AlInGaN is used, since movement speed of holes is significantly reduced, overflow probability of electrons may be increased. In this case, a solution for preventing the overflow of electrons by increasing a thickness of the electron blocking layer 41 may be considered, but the thickness of the electron blocking layer 41 is restrictively increased to smoothly inject the holes into the active region. Therefore, by forming the first barrier layer 39b1 to have the band gap wider (e.g., not less than about 0.5 eV) than that of other barrier layers, the movement speed of the electrons is decreased, thereby making it possible to effectively prevent the overflow of electrons. However, in the case in which the content of Al contained in the first barrier layer 39b1 is excessively increased to not less than about 20%, the lattice mismatching between the first barrier layer 39b1 and the electron injection layer 37, and between the first barrier layer 39b1 and the well layer 39w is increased, thereby making it possible to degrade crystal quality of the active region 39.

Meanwhile, the first barrier layer preferably has substantially the same thickness (e.g., about 45 Å) as or a thickness thicker than that of the remaining barrier layers except for the final barrier layer which is closest to the electron blocking layer 41 or the p-type contact layer 43. The first barrier layer may have the thickness of, for example, 40 to 60 Å, and may have particularly the thickness of about 45 Å.

The active region 39 may be in contact with the electron injection layer 37. The barrier layer and the quantum well layer of the active region 39 may be formed of the undoped layer to which the impurity is not doped, in order to improve crystal quality of the active region, but the impurity may also be doped in some or all of the active region in order to decrease a forward voltage.

Referring to again FIG. 1, the p-type contact layer 43 may be disposed on the active region 39, and the electron blocking layer 41 may be disposed between the active region 39 and the p-type contact layer 43. The electron blocking layer 41 may be formed of AlGaN or AlInGaN, and may be particularly preferably formed of AlInGaN in order to alleviate the lattice mismatching with the active region 39. Here, the electron blocking layer 41 may contain Al of about 36% and In of 3%, for example. The electron blocking layer 41 may be doped with p-type impurity, for example, Mg, at doping concentration of $5 \times 10^{19}$ to $5 \times 10^{20}/cm^3$.

The p-type contact layer 43 may include AlGaN layer, and may include, for example, a lower AlGaN high concentration doping layer 43a, an AlGaN low concentration doping layer 43b, and an upper AlGaN high concentration doping layer 43c. The lower and upper high concentration doping layers 43a and 43c may be doped with the p-type impurity, for example, Mg, at doping concentration of $5 \times 10^{19}$ to $2 \times 10^{20}/cm^3$. The low concentration doping layer 43b has doping concentration relatively lower than that of the lower and upper high concentration doping layers 43a and 43c, and is disposed between the lower high concentration doping layer 43a and the upper high concentration doping layer 43c. The low concentration doping layer 43b may be grown by blocking a supply of source gas (e.g., Cp2Mg) of Mg while being grown. Further, the content of impurity may be reduced by using $N_2$ gas except for $H_2$ gas as carrier gas during a process of growing the low concentration doping layer 43b. In addition, the low concentration doping layer 43b is formed to be relatively thicker than the lower and upper high concentration doping layers 43a and 43c. For example, the low concentration doping layer 43b may be formed to have a thickness of about 60 nm, and the lower and upper high concentration doping layers 43a and 43c may be formed to have a thickness of 10 nm, respectively. As a result, crystal quality of the p-type contact layer 43 may be improved, and loss of ultraviolet by the p-type contact layer 43 may also be prevented or alleviated by reducing impurity concentration.

Meanwhile, a delta doping layer 45 for reducing ohmic contact resistance may be disposed on the p-type contact layer 43. The delta doping layer 45 is doped with n-type or p-type at high concentration to reduce ohmic resistance between an electrode formed on the delta doping layer 45 and the p-type contact layer 43. The delta doping layer 45 may be formed to have a thickness of about 2 to 5 Å.

Meanwhile, a light emitting device having a horizontal structure or a light emitting device having a flip-chip structure may be manufactured by patterning epi-layers grown on the substrate 21, or a light emitting device having a vertical structure may also be manufactured by removing the substrate 21.

EXPERIMENTAL EXAMPLE 1

Samples have been manufactured by changing only the thicknesses of the well layers in a state in which other conditions are under the same conditions. All of the well layers were formed of InGaN, and the content of In contained in each well layer was a small quantity which is less than about 1%. A sample of Comparative Example 1 was manufacturing by growing the well layers for about 8 minutes, respectively, a sample of Example 1 was manufactured by growing the well layers for 4 minutes, respectively, and a sample of Example 2 was manufactured by growing the well layers for 3 minutes, respectively. The well layer of the sample of Comparative Example 1 had a thickness of about 3.5 nm.

Peak wavelengths of light radiated from light emitting devices of Comparative Example 1, Example 1, and Example 2 were 362.2 nm, 350.6 nm, and 346.5 nm, respectively, at 50mA. That is, the light emitting device having the peak wavelength which is less than 360 nm may be provided by reducing the thickness of the well layer formed of InGaN.

EXPERIMENTAL EXAMPLE 2

Samples have been manufactured by changing the content of Al contained in the barrier layers in a state in which other conditions are under the same conditions. That is, the samples have been manufactured by increasing a flow rate of source gas of Al by 30% (Example 2-2), 60% (Example 2-3), and 90% (Example 2-4) as compared to the flow rate of the source gas of Al at the time of growing the barrier layer of a reference sample (Example 2-1). In the case of the reference sample (Example 2-1), the content of Al contained in most barrier layers was about 20%.

The peak wavelengths of light radiated from the respective samples of the Examples 2-1, 2-2, 2-3, and 2-4 were 345.5 nm, 342.9 nm, 342.4 nm, and 341.3 nm, respectively, at 50 mA.

The peak wavelength of the light emitting device may be reduced by increasing the content of Al contained in the barrier layer even though the thickness of the well layer is uniform.

Figure 3:
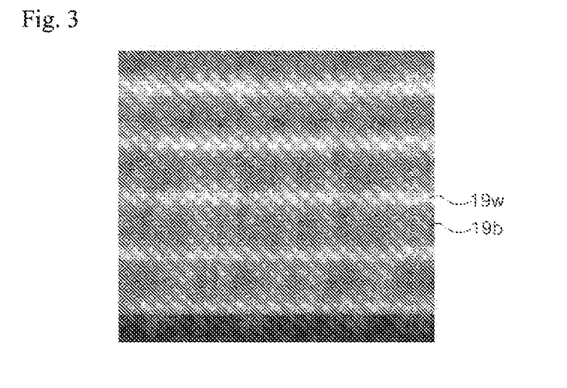
FIG. 3 is a TEM photograph of the multiple quantum well structure manufactured according to an exemplary embodiment of the present invention.

FIG. 3 is a cross-sectional TEM photograph illustrating a quantum well structure of the reference sample (Example 2-1) manufactured according to an exemplary embodiment of the present invention, and it may be seen that the well layer has a thickness of about 1.6 nm and the barrier layer has a thickness of about 4.7 nm.

Figure 4:
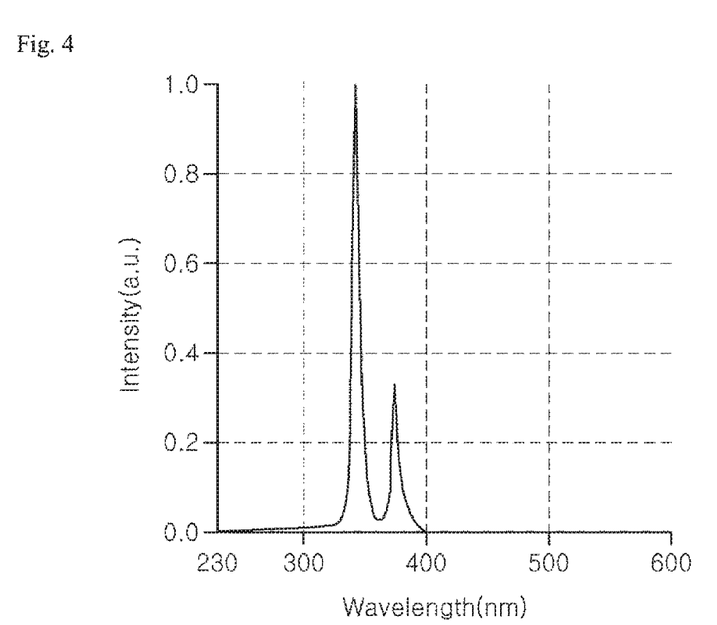
FIG. 4 is a graph illustrating an optical spectrum of a light emitting device manufactured according to an exemplary embodiment of the present invention.

Meanwhile, FIG. 4 is a graph illustrating a light emitting spectrum of the reference sample (Example 2-1) manufactured according to an exemplary embodiment of the present invention.

Referring to FIG. 4, ultraviolet having a peak wavelength of a relatively long wavelength which is not less than 360 nm together with ultraviolet having a peak wavelength of a relatively short wavelength which is less than 360 nm is observed.

The ultraviolet having the short wavelength is determined as light radiated from the well layer, and the ultraviolet having the long wavelength is determined to be radiated by light excitation from a GaN layer or an InGaN layer having a band gap narrower than that of the well layer by the light radiated from the well layer.

That is, according to the exemplary embodiments of the present invention, the well layer formed of GaN or InGaN is adopted, but the well layer has the band gap relatively wider than a bulk band gap of GaN. Therefore, energy of light radiated from the well layer is higher than band gap energy of the n-type contact layer 27 or other GaN epi-layers. Therefore, the light radiated from the well layer is traveled to the GaN epi-layers, such that light excitation may occur, and as a result, light corresponding to the band gap of GaN may be radiated from the GaN epi-layers.

The invention claimed is:

1. A light emitting device comprising:
an n-type contact layer;
a p-type contact layer; and
an active region having a multiple quantum well structure disposed between the n-type contact layer and the p-type contact layer,
wherein the light emitting device radiates ultraviolet light of a spectrum in a spectral range, the spectrum having a first peak and a second peak and wherein the first peak is in the range of 340 nm to 360 nm and the second peak is in the range of 360 nm to 400 nm.

2. The light emitting device of claim 1, wherein the second peak is at a wavelength that is greater than a wavelength of the first peak.

3. The light emitting device of claim 1, wherein the second peak has a lower energy than light emitted at the first peak wavelength.

4. The light emitting device of claim 1, wherein the n-type contact layer includes gallium nitride (GaN) and the p-type contact layer includes aluminum gallium nitride (AlGaN).

5. The light emitting device of claim 1, wherein the active region includes a barrier layer including gallium nitride (GaN).

6. The light emitting device of claim 1, wherein the active region includes at least one of indium (In) or aluminum (Al).

7. The light emitting device of claim 1, wherein the p-type contact layer includes two layers that have different AlGaN concentration from each other.

8. A light emitting device comprising:
an n-type contact layer;
a p-type contact layer; and
an active region having a multiple quantum well structure disposed between the n-type contact layer and the p-type contact layer,
wherein the light emitting device radiates ultraviolet light of a spectrum in a spectral range, the spectrum having a first peak and a second peak and wherein the multiple quantum well structure comprises a plurality of barrier layers and wherein a barrier layer closest to the n-type contact layer has a higher Al content than other barrier layers in the plurality of the barrier layers.

9. The light emitting device of claim 8, wherein the second peak is at a wavelength that is greater than a wavelength of the first peak.

10. A light emitting device comprising:
an n-type contact layer;
a p-type contact layer; and
an active region having a multiple quantum well structure disposed between the n-type contact layer and the p-type contact layer,
wherein the light emitting device radiates ultraviolet light of a spectrum in a spectral range, the spectrum having a first peak and a second peak and wherein energy of light radiated from the light emitting device is higher than band gap energy of the n-type contact layer.

11. The light emitting device of claim 10, wherein the active region includes at least one of indium (In) or aluminum (Al).

12. A light emitting device comprising:
an n-type contact layer;
a p-type contact layer formed over the n-type contact layer; and
an active layer arranged between the n-type contact layer and the p-type contact layer and including barrier layers and well layers that are stacked alternately with each other,
wherein the well layers include a first well layer radiating ultraviolet light having a first peak at a wavelength in the range of 340 nm to 360 nm and energy of light radiated from the well layer is higher than band gap energy of the n-type contact layer.

13. The light emitting device of claim 12, wherein the p-type contact layer includes a lower AlGaN high concentration doping layer, an upper AlGaN high concentration doping layer, and an AlGaN low concentration doping layer disposed between the lower AlGaN high concentration doping layer and the upper AlGaN high concentration doping layer.

14. The light emitting device of claim 12, wherein the well layers have a thickness not less than 1 nm.

15. The light emitting device of claim 12, wherein the well layers are free of Al.

16. The light emitting device of claim 12, wherein the ultraviolet light has an additional peak at a wavelength greater than the wavelength of the first peak.

17. The light emitting device of claim 16, wherein the additional peak has a lower energy than that of the peak.

18. The light emitting device of claim 16, wherein the additional peak wavelength is in the range of 360 nm to 400 nm.

19. The light emitting device of claim 12, wherein the barrier layers of the active region include GaN.

20. The light emitting device of claim 12, wherein the barrier layers include a first barrier layer that is closest to the n-type contact layer and has higher content of Al than other well layers.

* * * * *